United States Patent [19]
Koike

[11] Patent Number: 4,590,396
[45] Date of Patent: May 20, 1986

[54] INTEGRATED MOSFET TRANSFER GATE

[75] Inventor: Hideharu Koike, Yokohama, Japan

[73] Assignee: Tokyo Shibaura Denki Kabushiki Kaisha, Kawasaki, Japan

[21] Appl. No.: 516,887

[22] Filed: Jul. 25, 1983

[30] Foreign Application Priority Data

Jul. 26, 1982 [JP] Japan ................................. 57-129796

[51] Int. Cl.$^4$ ......................................... H03K 17/693
[52] U.S. Cl. .................................. 307/572; 307/443; 307/577; 307/579
[58] Field of Search .................... 307/200 B, 443, 353, 307/240, 572, 577, 579, 264, 582–585, 576, 452

[56] References Cited
U.S. PATENT DOCUMENTS

| | | | |
|---|---|---|---|
| 3,457,435 | 7/1969 | Burns et al. .......................... | 307/251 |
| 3,789,244 | 1/1974 | Provanzano ......................... | 307/579 |
| 3,942,039 | 3/1976 | Kikuchi et al. ..................... | 307/572 |
| 4,080,539 | 3/1978 | Stewart ............................... | 307/264 |
| 4,198,580 | 4/1980 | Culmer ........................... | 307/200 B X |
| 4,307,308 | 12/1981 | Sano ............................... | 307/264 X |
| 4,308,468 | 12/1981 | Olson .............................. | 307/572 X |
| 4,446,390 | 5/1984 | Alaspa ................................ | 307/579 |

*Primary Examiner*—Stanley D. Miller
*Assistant Examiner*—D. R. Hudspeth
*Attorney, Agent, or Firm*—Finnegan, Henderson, Farabow, Garrett & Dunner

[57] ABSTRACT

An integrated circuit has a plurality of MOSFETs between input and output terminals. The MOSFETs are connected in series and are provided with signals to the gates thereof. Adjacent MOSFETs are of different conduction types and are provided with phase-inverted control signals to the gates thereof.

3 Claims, 9 Drawing Figures

INTEGRATED MOSFET TRANSFER GATE

BACKGROUND OF THE INVENTION

1. Field of the Invention

This invention relates to a transfer-gate circuit used with a complementary MOSFET integrated circuit (CMOS-IC).

2. Background of the Invention

The power consumed by a CMOS-IC is less than that consumed by an integrated circuit of the MOSFET single channel type. CMOS-ICs are now used in various fields, for example, in logic circuits, memory circuits and microcomputers. A prior art transfer-gate circuit used in a CMOS-IC is illustrated in FIG. 1. The transfer-gate has two MOSFETs 1 and 2 which are connected in parallel and are respectively N-channel type and P-channel type MOSFETs. Each source electrode of MOSFETs 1 and 2 is connected to an input terminal 3. The drain electrodes of the MOSFETs 1 and 2 are connected to an output terminal 4. An input signal applied to the input terminal 3 is transmitted to the output terminal 4 when the MOSFETs 1 and 2 become conductive, i.e., are switched ON.

The MOSFETs 1 and 2 are controlled by control signals $\bar{\phi}$ and $\phi$ applied to the gate electrodes thereof. In the case of N-channel MOSFET 1, the MOSFET will be conductive, i.e. ON, when control signal $\phi$ is at a high level, and non-conductive, i.e. OFF, when control signal $\phi$ is a low level. The P-channel MOSFET 2 operates complementarily. Therefore, the transfer-gate circuit comprising MOSFETs 1 and 2 is controlled by control signals $\phi$ and $\bar{\phi}$. Control signal $\bar{\phi}$ is the inverted signal of the control signal $\phi$. The input signal is transferred to the output when the control signal $\phi$ is at a high level, but is not transferred when the control signal $\phi$ is low level.

For example, when the power supply voltage is five volts, the threshold voltage $V_{th}$ of the P-channel MOSFET 2 is in general set up at $-0.8$ V and that of the N-channel MOSFET 1 is set up at $+0.8$ V. But this Vth will be changed by the following various effects. First, $V_{th}$ varies corresponding to the gate length. Generally, it is difficult to maintain a uniform gate length dimension in the manufacturing process, and the length of the gate may have a slightly different value in each lot or wafer. This is because it is difficult in the present process to hold all the conditions of the process constant for each lot or wafer. Second, $V_{th}$ shifts in response to ionic radiation, for example, gamma-rays and X-rays emanating from external sources. These rays may be produced from the material constructing the device. The value of $V_{th}$ will be shifted in the minus direction semipermanently. Third, $V_{th}$ may be effected by hot electrons. Hot electrons have high energy and can be accumulated in the gate insulation layer. Hot electrons can be produced by impact ionization which occurs in the P-N junction of the drain region of the MOSFET. If the $V_{th}$ of N-channel MOSFET 1 was shifted to a minus voltage, for example to $-0.1$ volts from $+0.8$ volts, the MOSFET 1 will not turn OFF when the control signal $\phi$ drops to its low level, namely ground potential, and the input and output terminals become the same level. As a result, the transfer-gate will lose the capacity to transfer signals in response to the control signals $\phi$ and $\bar{\phi}$.

Next the noise suppression margin in this circuit is only a fraction of $V_{th}$ so this circuit is sensitive to noise. For example, assuming that the control signal $\phi$ is 0 volts and the control signal $\bar{\phi}$ is 5 volts the transfer-gate is non-conductive, but MOSFET 2 will conduct if a noise level lower than $-|V_{th}|$ appears in the control signal $\bar{\phi}$. Therefore, the transfer-gate will malfunction. Generally, the noise present in a power supply signal is in the range of $\pm 10\%$, but may at times exceed that amount. In these cases, the transfer-gate circuit could operate by mistake. Furthermore, when $V_{th}$ is maintained at a high value in order to increase the noise suppression margin, the range of usable power supply, which is determined by $|V_{th}|$ and the breakdown voltage of the circuit, is reduced because the power supply must be more than $V_{th}$. Accordingly, the relationship of $V_{th}$ and the power supply potential is an important factor in the design of the circuit.

SUMMARY OF THE INVENTION

It is accordingly an object of this invention to provide a novel integrated circuit having a transfer-gate circuit with high reliability.

Another object of this invention is to provide an improved integrated circuit having a plurality of MOSFETs connected in series and including different conduction type MOSFETs.

Another object of this invention is to provide an integrated circuit having a high noise suppression margin.

In accordance with the invention there is provided an integrated circuit including an output terminal and an input terminal receiving an input signal; a first MOSFET connected to the input terminal and provided with a first gate control input; a second MOSFET connected in series to the first MOSFET and to the output terminal, and being of a different conduction type from the first MOSFET and provided with a second gate control input; and means for supplying phase-inverted control signals to said first and second gate control inputs whereby a predetermined state of said control signals renders said MOSFETs conducting and couples said input signal to said output terminal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
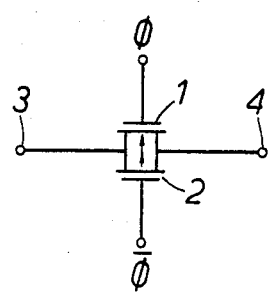
FIG. 1 is an integrated circuit of a conventional transfer-gate circuit.
Figure 2:
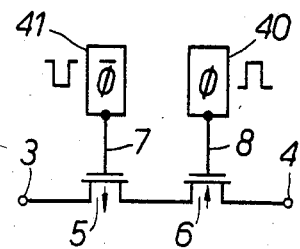
FIG. 2 is a circuit diagram of a preferred embodiment of the invention.

Referring now to the drawings, wherein like reference numerals designate identical or corresponding parts throughout the several views, and more particularly to FIG. 2 thereof, one embodiment of the integrated circuit device of this invention is illustrated.

As shown in FIG. 2, P-channel MOSFET 5 and N-channel MOSFET 6 are connected in series between an input terminal 3 and an output terminal 4. Control signals $\phi$ and $\overline{\phi}$ are generated by signal sources 40 and 41 and are applied, respectively, to the gate electrodes 8 and 7 of the MOSFETs 6 and 5 and operate to control the conductance of the MOSFETs 6 and 5. The control signals $\phi$ and $\overline{\phi}$ are phase-inverted signals, i.e., they are the complement of each other, and when the control signal $\phi$ is high the MOSFETs 5 and 6 are ON and the input signal is transmitted to the output terminal 4. In this circuit the $V_{th}$ of the MOSFETs 5 and 6 is configured to preferably be $-0.8$ volts and $+0.8$ volts, respectively, in the absence of external factors such as noise. It should be appreciated, however, that these threshold voltage levels may be set to be other than $+0.8$ V in the absence of noise without departing from the spirit or scope of the present invention.

When MOSFET 6 is subjected to the previously discussed external factors, causing its $V_{th}$ to shift to $-0.1$ volts from $+0.8$ volts, MOSFET 6 will turn ON when control signal $\phi$ is at its low level. Namely the MOSFET 6 is always ON regardless of the control signal $\phi$. But, the $V_{th}$ of the P-channel MOSFET 5 is shifted to a greater minus level from $-0.8$ volts, because the direction of shifting is generally the same regardless the channel type. So, the MOSFET 5 is made more non-conductive when the control signal $\overline{\phi}$ is at its high level (corresponding to the low state of $\phi$) and the transfer-gate does not lose its function.

Thus, even if one MOSFET 6 turns ON from OFF in response to noise or similar external signals, the other MOSFET 5 is maintained at OFF and the transfer-gate does not operate mistakenly.

For example, consider the case in which input terminal 3 is at $+5$ V and control signal $\phi$ is low, i.e., 0 V, so that no transfer is desired. Now suppose noise of magnitude greater than $|V_{th}|$ were imposed on both control signals $\phi$ and $\overline{\phi}$ such that these signals were increased and decreased, respectively. This condition is the severest that can be imposed on the circuit. In this case, MOSFET 5 is turned from OFF to ON by the effect of the noise which decreases $\overline{\phi}$ by an amount greater than $|V_{th}|$. Although the noise also increases $\phi$ by an amount greater than $|V_{th}|$ and thus turns MOSFET 6 from OFF to ON as well, the voltage between the gate electrode of MOSFET 6 and the output terminal 4 is maintained at $V_{th}$ so that the voltage which appears at output terminal 4 is the gate voltage, including noise, minus $V_{th}$. For instance, if the noise signal is $+1$ v and $V_{th}$ is $+0.8$ v, then the voltage at output terminal 4 is $+0.2$ v. Since this output level is much lower than the $+5$ v input level and will be interpreted by other devices coupled to terminal 4 as being low, the circuit has accomplished the desired result in that transfer is not effected. Therefore, the circuit demonstrates high immunity to noise.

Figure 3:
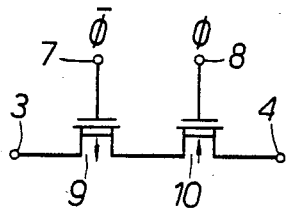
FIGS. 3–7 are circuit diagrams of other embodiments of the invention.

FIG. 3 shows another embodiment of this invention. In this circuit, depletion type P-channel and N-channel MOSFETs 9 and 10 are used instead of enhancement type MOSFETs in FIG. 2. In the circuit of FIG. 2, the level of the output signal is decreased as much as $V_{th}$ by the characteristic of the enhancement type MOSFET when the high level is transferred. But the level of the output signal isn't decreased in the depletion type MOSFET, and the high level is transferred undiminished. On the other hand, the transferred signal is limited because both MOSFETs 9 and 10 will be ON when the input signal level is fully high and the output signal level is fully low. Now, supposing the $V_{th}$ of MOSFET 9 is $+0.1$ volts and the $V_{th}$ of MOSFET 10 is $-0.1$ volts. And the high level of the signal $\phi$ is 5 volts and the low level is 0 volts. In these states, both MOSFETs 9 and 10 are normally ON if the potential of the terminal 3 is higher than 4.9 volts and that of the terminal 4 is less than 0.1 volts. So the high level of the input $V_{AH}$ and the low level of the output terminal $V_{BL}$ is held in the following limits:

$$V_{cc}-V_{thP} \leq V_{AH} \leq V_{cc}$$

$$0 \leq V_{BL} \leq -V_{thN}$$

wherein, $V_{thP}$ and $V_{thN}$ are respectively $V_{th}$ of the P-channel and N-channel MOSFETs 9 and 10, and $V_{cc}$ is the power supply potential and the high level of the signal $\phi$ or $\overline{\phi}$. This circuit is capable of transferring a 0 volt input signal without any level shift. Namely, it is the case that the level of the input terminal is fixed at 0 volts. Then the output terminal 4 can be fixed at 0 volts, or may be fixed at the power supply potential or at the high level.

Figure 4:
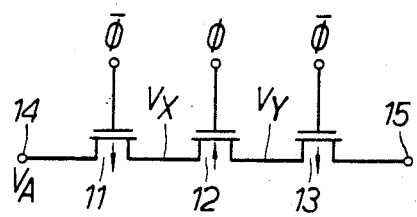

FIG. 4 shows another embodiment of this invention. This circuit has three MOSFETs 11, 12 and 13 connected in series, with each MOSFET adjoining a MOSFET of different conduction type. The signal to the input terminal 14 is transferred to the output terminal 15 in response to control signals $\phi$ and $\overline{\phi}$ applied to the fates of the MOSFETs 11, 12 and 13. This circuit is symmetrical and doesn't have directional transfer characteristics. The basic operational conditions of this circuit are as follows:

$$|V_{thN}| < V_{cc} \quad (1)$$

$$|V_{thP}| < V_{cc} \quad (2)$$

and $$V_{thP} - V_{thN} < V_{cc} \quad (3)$$

wherein, $V_{thN}$ and $V_{thP}$ are respectively the $V_{th}$ of the N-channel and P-channel MOSFETs, and $V_{cc}$ is the power supply potential and the high level of the signal. This bias condition is explained as follows.

At first the following formula is the condition that MOSFET 11 changes to On in response to a control signal level of $\phi=0$, namely when all the MOSFETs 11, 12 and 13 must be OFF.

$$V_A > V_{cc} - V_{thP} \quad (4)$$

wherein $V_A$ is the level of the input signal at terminal 14 and $V_X$ is the level of the connecting point between MOSFETs 11 and 12. The condition defining the ON state for MOSFET 12 is given by the following formula:

$$V_Y < -V_{thN} \quad (5)$$

wherein $V_Y$ is the level of the connecting point between MOSFETs 12 and 13. The condition defining the ON state for MOSFET 13 is given by the following formula:

$$V_Y > V_{cc} - V_{thP} \quad (6)$$

All formulas 4 to 6 must hold simultaneously for the signal at terminal 14 to be transferred to the terminal 15. But when the formulas 5 and 6 hold at the same time the formula $$V_{cc} < V_{thP} - V_{thN} \qquad (7)$$

must also hold. Therefore when formulas (1) to (3) hold, the terminal 14 can never be coupled to the terminal 15 when the control signal $\phi$ is 0. The conditions (1) to (3) from which the MOSFET can be controlled by the control signal applied to its gate are understood from the above explanation, and are all of the conditions that the circuit is operated in normally.

According to the above explanation, even if the noise level is more than $|V_{th}|$, the transfering of a signal between the input terminal and the output terminal will occur normally. Namely, if the noise level is $|V_{th}| = +0.1$ V, then the effective threshold voltages of the N-channel and P-channel MOSFETs become $-0.1$ V and $+0.1$ V, respectively. But if conditions (1) to (3) pertain for the effective threshold voltages, the circuit will operate normally notwithstanding the presence of noise in the signals.

The range of the power supply used in this circuit is from $|V_{th}|$ of the MOSFETs to the breakdown voltage of the P-N junction in the semiconductor substrate in which the circuit is formed. The $|V_{th}|$ of the MOSFET can be depressed to the lowest value, because the noise level can be greater than $|V_{th}|$. So the usable range of the power supply is extended and this limitation in designing such circuits is removed.

This circuit can be also used to provide a resistance function since the resistance value between the input and output terminal is constant in the ON state of the MOSFETs if the conductance of the N- and P-channel type MOSFETs is equal. The conductance of a MOSFET is mainly determined by the geometrical configuration of the MOSFET, and is proportional to W/L, wherein W is the width of the MOSFET channel and L is the length of the channel. It is preferred that the width of the channel of MOSFET 12 be established at twice the width of the channel of MOSFET 11 or 13. The channel length of the MOSFETs 11, 12 and 13 should be equal.

This circuit has a resistance value which is independent of the input voltage. The circuit can thus be used to supply the feedback resistance for a linear amplifier, and so on.

The circuits of FIGS. 2 and 3 can also be used to supply resistance functions.

Figure 5:
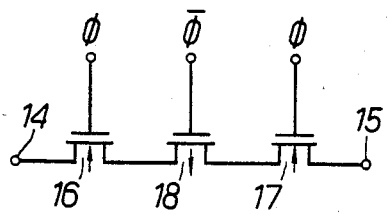

FIG. 5 shows a further embodiment of this invention. In this circuit, the conduction type of the MOSFETs is reversed with respect to the FIG. 5 circuit. Namely, an N-channel MOSFET 16 is connected to input terminal 14 and an N-channel MOSFET 17 is connected to output terminal 15. A P-channel MOSFET 18 is arranged between the MOSFETs 16 and 17. The conduction state of each MOSFET is controlled by the control signal $\phi$ or $\overline{\phi}$ which is applied to the gate thereof. This circuit has substantially the same characteristic as the circuit of FIG. 4.

Figure 6:
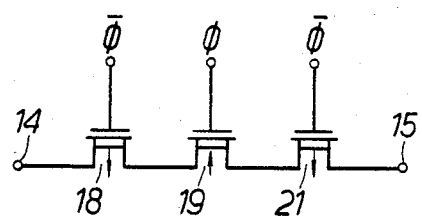

FIG. 6 shows still a further embodiment of the type invention. In this embodiment, depletion type P-channel MOSFETs 18, 20 and are used with a depletion N-channel MOSFET 19 so the input signal is transferred to the output terminal 15 without a drop in voltage. The conditions (1) and (3) are also satisfied in this circuit.

Figure 7:
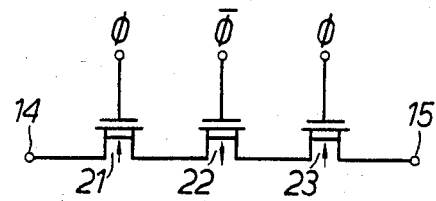

FIG. 7 shows another embodiment of this invention. In this circuit, the conduction type of the MOSFETs is the reverse of that used in the FIG. 6 circuit. Depletion type N-channel MOSFET 21 is connected to the input terminal and depletion type N-channel MOSFET 23 is connected to the output terminal. A depletion type P-channel MOSFET 22 is arranged between MOSFETs 21 and 23.

Figure 8:
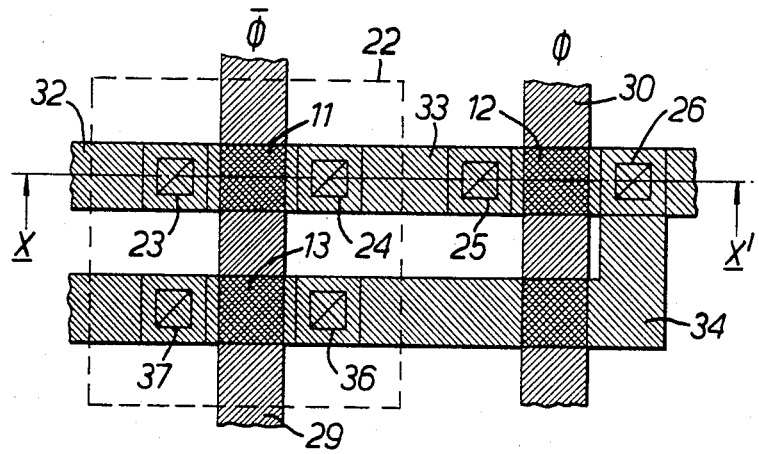
FIG. 8 is a plan view of the integrated circuit of the invention.
Figure 9:
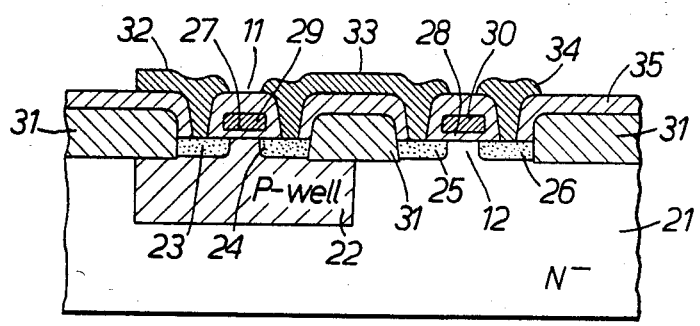
FIG. 9 is a sectional view of the integrated circuit of the invention.

FIG. 8 shows a plan view in the case where the circuit of FIG. 4 is constructed on a semiconductor substrate. FIG. 9 shows a sectional view of the circuit device taken along the line X-X' of FIG. 8. As shown in these figures, the three MOSFETs 11, 12 and 13 of FIG. 4 are constructed on an N-type semiconductor substrate 21. P-type region 22 is formed in the semiconductor substrate 21, and two N-type regions 23 and 24 are respectively the source and drain regions of the MOSFET 11. Two P-type regions 25 and 26 are formed in the semiconductor substrate 21. The two P-type regions 25 and 26 are respectively the drain and source regions of the MOSFET 12. Gate insulation layers 27 and 28 and gate electrodes 29 and 30 are formed on the channel regions between the sources 23 and 26 and the drains 24 and 25 of the MOSFETs 11 and 12. The MOSFETs 11 and 12 are separated from each other and are respectively surrounded by a thick insulation layer 31. Electrodes 32, 33 and 34 may be made of aluminum and are connected to source regions 23 and 26 and drain regions 24 and 25 through openings in the insulation layer 35. The electrode 32 is connected to the input terminal, the electrode 33 connects the MOSFET 11 and the MOSFET 12, and the electrode 34 is connected to the drain region 36 of the MOSFET 13. The MOSFET 13 is formed similarly to the MOSFET 11, and the source 37 of the MOSFET 13 is connected to the output terminal.

In the above embodiments, the transfer-gate circuit comprises two or three MOSFETs. However, the same principle of operation can be employed in circuits utilizing a larger number of MOSFETs.

Additional modifications and variations of the invention are possible in the light of the above teachings. It is therefore to be understood that the invention may be practiced otherwise than as specifically described, the scope of the invention being defined by the following claims.

What is claimed is:
1. An integrated circuit comprising:
   an output terminal and an input terminal receiving an input signal;
   a first depletion type MOSFET having a source to drain current path connected to said input terminal and provided with a first gate control input;
   a second depletion type MOSFET having a source to drain current path connected in series with said first MOSFET source to drain current path and to said output terminal, said second depletion type MOSFET being of a different conduction type from said first depletion type MOSFET and provided with a second gate control input; and
   control means for supplying first and second phase-inverted control signals to said first and second gate control inputs whereby only a predetermined state of said control signals renders said MOSFETs conducting and couples said input signal to said output terminal.
2. An integrated circuit comprising:

an output terminal and an input terminal receiving an input signal;

a first MOSFET connected to said input terminal and provided with a first gate control input;

a second MOSFET connected in series with said first MOSFET, and being of a different conduction type from said first MOSFET and being provided with a second gate control input;

a third MOSFET connected in series with said second MOSFET and to said output terminal, and being of the same conductivity type as said first MOSFET and having a third gate control input; and control means for supplying a first control signal to said first and third gate control inputs and a second control signal to said second gate control input, said second control signal being phase-inverted with respect to said first control signal, whereby a predetermined state of said control signals renders said MOSFETs conducting and couples said input signal to said output terminal.

3. An integrated circuit according to claim 2 wherein the first, second and third MOSFETs are depletion type MOSFETs.

* * * * *